(12) United States Patent
Suplinskas

(10) Patent No.: US 6,309,702 B1
(45) Date of Patent: Oct. 30, 2001

(54) PROCESS FOR THE PRODUCTION OF IMPROVED BORON COATINGS

(75) Inventor: Raymond J. Suplinskas, Haverhill, MA (US)

(73) Assignee: Textron Systems Corporation, DE (US)

( * ) Notice: Subject to any disclaimer, the term of this patent is extended or adjusted under 35 U.S.C. 154(b) by 0 days.

(21) Appl. No.: 09/382,054

(22) Filed: Aug. 24, 1999

Related U.S. Application Data

(60) Provisional application No. 60/098,496, filed on Aug. 31, 1998.

(51) Int. Cl.$^7$ ............... C23C 16/22; C23C 16/26; C23C 16/46; B05D 3/06
(52) U.S. Cl. ............. 427/228; 427/249.2; 427/255.78; 427/900; 427/557; 427/590
(58) Field of Search ................. 427/557, 590, 427/228, 249.2, 249.3, 249.4, 249.5, 249.6, 900, 255.38

(56) References Cited

U.S. PATENT DOCUMENTS

| | | | |
|---|---|---|---|
| 4,863,798 | * | 9/1989 | Arnez et al. ............ 428/368 |
| 5,067,999 | * | 11/1991 | Streckert et al. ......... 156/89.26 |
| 5,238,710 | * | 8/1993 | Ahmad et al. ........... 427/553 |
| 5,348,774 | * | 9/1994 | Golecki et al. .......... 427/543 |
| 5,654,059 | * | 8/1997 | Hecht .................. 428/65.9 |
| 5,682,594 | * | 10/1997 | Kennedy et al. ......... 428/549 |
| 5,759,622 | * | 6/1998 | Stover ................ 427/249.15 |

* cited by examiner

Primary Examiner—Shrive P. Beck
Assistant Examiner—Michael Cleveland
(74) Attorney, Agent, or Firm—Mills & Onello LLP

(57) ABSTRACT

Improved articles of manufacture are disclosed, together with methods for preparing such articles, whereby the surface of a graphite or comparable substrate is first densified with carbon to reduce surface porosity while still retaining sufficient surface texture to enhance the adherence of a subsequently applied boron coating.

15 Claims, 2 Drawing Sheets

PROCESS FOR THE PRODUCTION OF IMPROVED BORON COATINGS

CROSS-REFERENCE TO RELATED APPLICATION

This application claims priority based on U.S. Provisional Patent Application Ser. No. 60/098,496 filed Aug. 31, 1998.

BACKGROUND OF THE INVENTION

Boron coatings on graphite substrates have many useful applications. With its thermal and chemical stability, boron can be employed in the ion sources of ion implantation machines used in the manufacture of semiconductor devices. Particularly in the case of boron ion implantation, a boron or boron-coated ion source is capable of providing higher beam current, higher beam purity and lower erosion rates than ion sources made of refractory metals such as tungsten or molybdenum. Other components in ion implantation machines, such as beam dumps, could also advantageously be made of boron or boron-coated materials. Other applications occur in nuclear devices where the high temperature stability and large neutron cross-section of boron can be used in shielding and in reactor walls.

Pure elemental boron is difficult to fabricate into such components by ordinary means. The pure element is refractory and brittle, and near its melting point, boron has a very high vapor pressure. Hence, the usual metal fabrication process of casting and machining cannot be used to fabricate components. Neither can ceramic processing techniques be applied readily. Hot-pressing of boron powders to fabricate plates or shapes leads to high residual stresses which result in immediate or eventual failure during use.

Chemical vapor deposition (CVD) is a practical method for forming boron coatings. The manufacturing of CVD boron fibers is a well-known technology. Boron-coated fibers prepared by CVD processes are in widespread use. For example, a description of one process of application of a boron-based refractory metal on a silicon carbide filament is taught by U.S. Pat. No. 4,481,257, which patent is incorporated herein by reference. In a typical manufacturing process, a small diameter substrate wire, typically tungsten or carbon, is heated in the presence of a boron halide and hydrogen. The boron halide is reduced and elemental boron deposits on the substrate. Tungsten substrate wires are typically in the range of 10 to 12 microns in diameter, while carbon substrate wires are typically somewhat thicker in the range of 25 to 50 microns in diameter. The resulting boron-coated fibers are in the range of 100 to 200 microns in diameter.

The components required for semiconductor applications, for example, have dimensions much larger than those of the fibers, for example in the range of 5 to 15 centimeters. Application of fiber CVD technology to the formation of boron coatings on these substrates does not provide suitable results. The boron coatings exhibit multiple cracks and tend to spall off the substrates. A major reason for this is a mismatch of coefficients of thermal expansion (CTE) between the substrate and the boron coating. The coatings are deposited at temperatures in excess of 1000° C. Upon cooling to ambient temperature, the differential shrinkage between the substrate and coating results in stresses which crack the coating and/or result in lack of adhesion (i.e. produce a fracture at the interface between the coating and the substrate). This is not a problem in the CVD formation of small-diameter fibers because the thermally-induced strains and the resultant stresses are too small to cause this type of fracturing. For larger substrates, thermal stresses can be minimized by selecting a substrate material which has the same thermal expansion characteristics as those of boron.

While the use of graphite substrates which match the CTE of boron eliminates the macroscopic cracking observed with other substrates, the boron coatings produced on these graphite substrates by CVD technology are still deficient as they exhibit a high concentration of voids near the interface with the graphite substrate. In some circumstances, the voids may coalesce, producing large voided regions. Such voided regions are prone to fracture resulting in microscopic cracks and in the coating spalling off the substrate.

It is well known that the surface of a graphite article can be sealed by the application of a smooth sealing coating of pyrolytic graphite. While such smooth sealing coatings seal the surface porosity of the underlying graphite, they do not provide an appropriate surface for the CVD deposition of boron on large surfaces because the boron coatings generally are not adherent to these smooth coatings and tend to spall off the sealing coatings. It is hypothesized that the mechanical locking which occurs between the surface roughness of unsealed graphite and the conformal boron deposit is an important factor in the adhesion of the boron coatings.

For all of these reasons, prior art techniques for coating boron onto graphite substrates and the like have been unsatisfactory or had only limited utility. The improved substrate treatment and coating method of the present invention overcomes many or all of the problems with and deficiencies of the prior art techniques.

SUMMARY OF THE INVENTION

In the improved substrate treatment and coating method of the present invention, the surface of a graphite or comparable substrate that is to be coated with boron is first densified with carbon to reduce surface porosity while still retaining sufficient surface texture to enhance the adherence of the subsequently applied boron coating.

In one embodiment of the present invention, referred to herein as a rapid densification process, a relatively porous graphite substrate is immersed in a liquid hydrocarbon. While under immersion, the substrate is heated by suitable means to a temperature above the decomposition temperature of the hydrocarbon. This creates a temperature gradient through the substrate, the hottest portion being in the body interior, and the coolest being at the surface of the substrate. As hydrocarbon vapors diffuse into the substrate interior through the pores, they reach the hottest portion in the interior of the body, where the temperature exceeds the decomposition temperature of the hydrocarbon. At this temperature, the vapors decompose and deposit solid carbon in the pores. The resultant substrate is thereby densified and prepared for subsequent boron deposition.

In a second invention embodiment, chemical vapor infiltration of the substrate pores with a gaseous hydrocarbon is employed to prepare the substrate surface by at least partially filling the surface porosity, while preserving adequate surface texture for good adherence of a subsequently applied boron coating. Under appropriate conditions identified below, excellent substrate bonding surfaces are achievable with both embodiments of this invention.

BRIEF DESCRIPTION OF THE DRAWINGS

The foregoing and other objects, features and advantages of the present invention will be apparent from the more particular description of preferred embodiments of the invention appearing below and as illustrated in the accompanying drawings in which like reference characters refer to the same parts throughout the different views. It will be understood that the drawings are not necessarily to scale, emphasis instead being placed upon illustrating the principles of the invention.

DETAILED DESCRIPTION OF PREFERRED EMBODIMENTS

Figure 1:
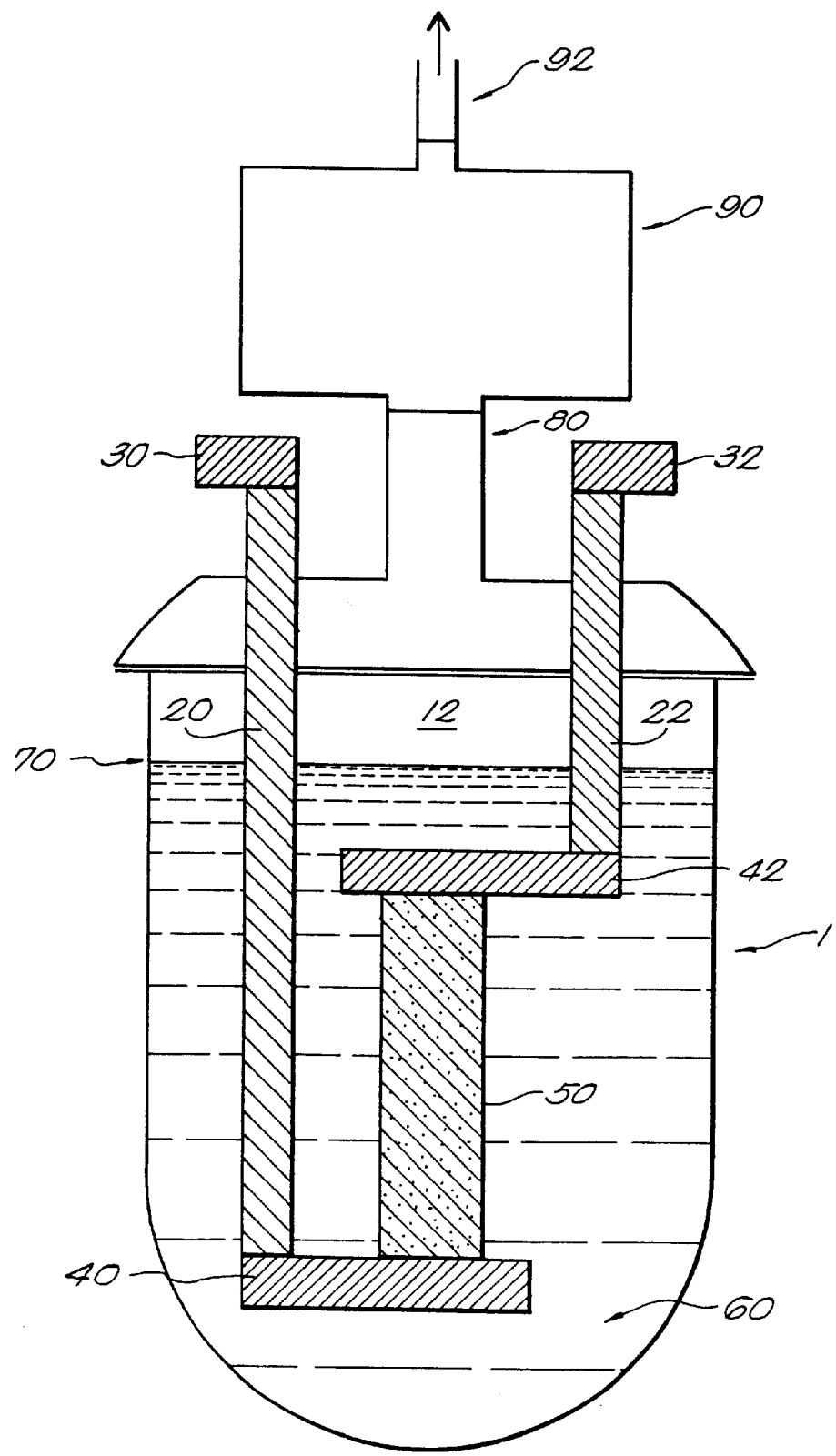
FIG. 1 is a schematic illustration of an apparatus suitable for carrying out the rapid densification embodiment of this invention.

This invention is directed to improved methods for preparing a generally porous substrate or preform for subsequent surface coating with boron. Graphite substrates, prepared for example by hot pressing graphite powders into the desired shape and size, are preferred substrates for this invention because graphite is not reactive with boron and has substantially the same coefficient of thermal expansion. Other materials having comparable properties, however, would also be useful as substrates in accordance with this invention. Because substrates formed from such materials would likely be made by hot pressing powders or similar techniques, the resulting substrates would have a degree of porosity. Accordingly, it is believed that all such substrates could benefit from the porosity-reduction treatment processes of this invention where the substrate surface is to be subsequently coated with boron.

Rapid Densification Embodiment

In the rapid densification (RD™) process for reducing substrate porosity by the deposition of carbon, a porous substrate is immersed in a liquid hydrocarbon, for example cyclohexane, and, while immersed, is heated by suitable means to a temperature above the decomposition (and boiling) temperature of the hydrocarbon. Heat loss at the surface of the substrate to the surrounding rapidly boiling liquid creates a steep temperature gradient through the substrate with the maximum temperature at the interior of the substrate body and the minimum temperature at the surface of the substrate. Vapors of the hydrocarbon diffuse into the substrate interior through the pores. When the hydrocarbon vapors reach a depth into the substrate at which the temperature is sufficiently high, the vapors decompose resulting in the deposition of solid carbon, which at least partially fills the pores of the substrate, and the production of gaseous byproducts. The depth at which this hydrocarbon decomposition temperature is achieved can be controlled by varying the power input to the substrate.

Rapid densification technology is generally known in the art, although it has not previously been utilized for the specific purpose of improving the quality, durability, and coating adhesion of a boron-coated article, specifically a boron-coated graphite substrate. Thus, rapid densification of a carbon preform by immersion in cyclohexane while the preform is heated to at least the decomposition temperature of cyclohexane is described in U.S. Pat. No. 4,472,454, which is incorporated herein by reference. More recent applications of the rapid densification technique are described in U.S. Pat. Nos. 5,389,152 (Thurston et al.); 5,397,595 (Carroll et al.); and 5,733,611 (Thurston et al.), each of which is incorporated herein by reference.

For rapid densification of porous carbon preforms, these patents teach that any hydrocarbon with an appropriate boiling point, such as cyclohexane, n-hexane, or benzene, could be used. Different liquid materials can be used in these rapid densification processes where, for example, it is desired to deposit silicon carbide or other materials in the pores of the preform. These patents further teach electrical resistance heating and induction heating as useful techniques for heating the porous preforms to the desired hydrocarbon (or other material) decomposition temperature. These heating techniques require that the porous preform have at least some degree of electrical conductivity. An alternative heating technique useful for the rapid densification process but not dependent on the electrical conductivity of the porous preform would be some type of radiant heating.

Since the determining factor in the rapid densification process of the present invention is the heat loss at the substrate surface, a useful measure of the process conditions is the total power input divided by the surface area of the substrate. For example, it has been found that surface treatment by the RD™ rapid densification process of this invention for a typical graphite substrate at a power level of 350 W/sq. in. produced the desired effect while undesirable results were obtained at power levels of about 50 W/sq. in. above or below this level. Although the optimum power level range (measured in energy units/unit of substrate area) at which efficient and effective rapid densification occurs will likely vary depending on process parameters such as choice of substrate and the selection of hydrocarbon, it is believed that an optimum power level range for carrying out rapid densification, and determinable by routine experimentation, will be established for each and every set of process conditions. The existence of such an optimal power level range for carrying out the rapid densification process is considered to be a novel and completely unexpected aspect of the present invention.

The rapid densification embodiment of this invention can be better understood by reference to the schematic illustration of FIG. 1. FIG. 1 shows a reaction vessel 1 fitted with a cover 10 to contain hydrocarbon liquid 60 and hydrocarbon and other vapors in the region 12 above the surface 70 of liquid 60. Electrode posts 20 and 22 pass through cover 10 and extend into the interior of reactor 1 and into liquid 60. Inside reactor 1, posts 20 and 22 are connected respectively to electrical contacts 40 and 42 which provide mechanical support for as well as electrical contact to the porous article 50 which is to be densified in accordance with the present invention. Reactor 1 contains sufficient hydrocarbon liquid 60 to completely immerse article 50 therein.

At the respective ends of electrode posts 20 and 22 outside reactor 1, lugs 30 and 32 respectively connect posts 20 and 22 to a supply of electrical power (not shown). Cover 10 includes an outlet 80 for hydrocarbon and other vapors escaping from the interior region 12 of reactor 1. Outlet 80 connects to a reflux condenser 90 to condense hydrocarbon vapor that escapes from region 12. Condensed liquid hydrocarbon is returned to reactor 1 through outlet 80 while non-condensible reaction products and uncondensed hydrocarbon vapors are exhausted from the system through vent 92.

FIG. 1 illustrates a practice of the rapid densification embodiment of the present invention wherein porous article 50 is heated by electrical resistance by applying electrical power at an appropriate level to electrode posts 20 and 22 for a sufficient period of time. It will be apparent that different component elements inside and outside reactor 1 would be utilized where article 50 is heated by induction or radiant heating or by some other such heating means.

Example 1 below utilized an apparatus substantially comparable to that illustrated in FIG. 1 for carrying out comparative tests to demonstrate the superiority of boron-coated graphite substrates when the substrates have been treated in accordance with the rapid densification embodiment of this invention prior to being coated with boron.

EXAMPLE 1

Substrate samples of DFP-2 grade graphite, purchased from POCO Graphite Inc. were machined to form 5.64"× 0.50"×0.092" coupons. The coupons were clamped between copper electrodes and submerged in cyclohexane contained in a three liter reaction vessel which was equipped with a reflux condenser.

After purging the reaction vessel with nitrogen, the surfaces of the coupons were densified in accordance with one embodiment of the present invention by resistively heating the coupons with DC current generated by a Hewlett-Packard™ regulated power supply for a period of thirty minutes. The total power input for each experiment was determined by multiplying the target value of watts per square inch by the surface area of the coupon. For values of 300, 350 and 400 watts per square inch, the voltage required was between 7 and 9 volts with the DC current in the range of 180 to 220 amperes. After completing this densification treatment, the coupons were dried overnight in a drying oven.

Figure 2:
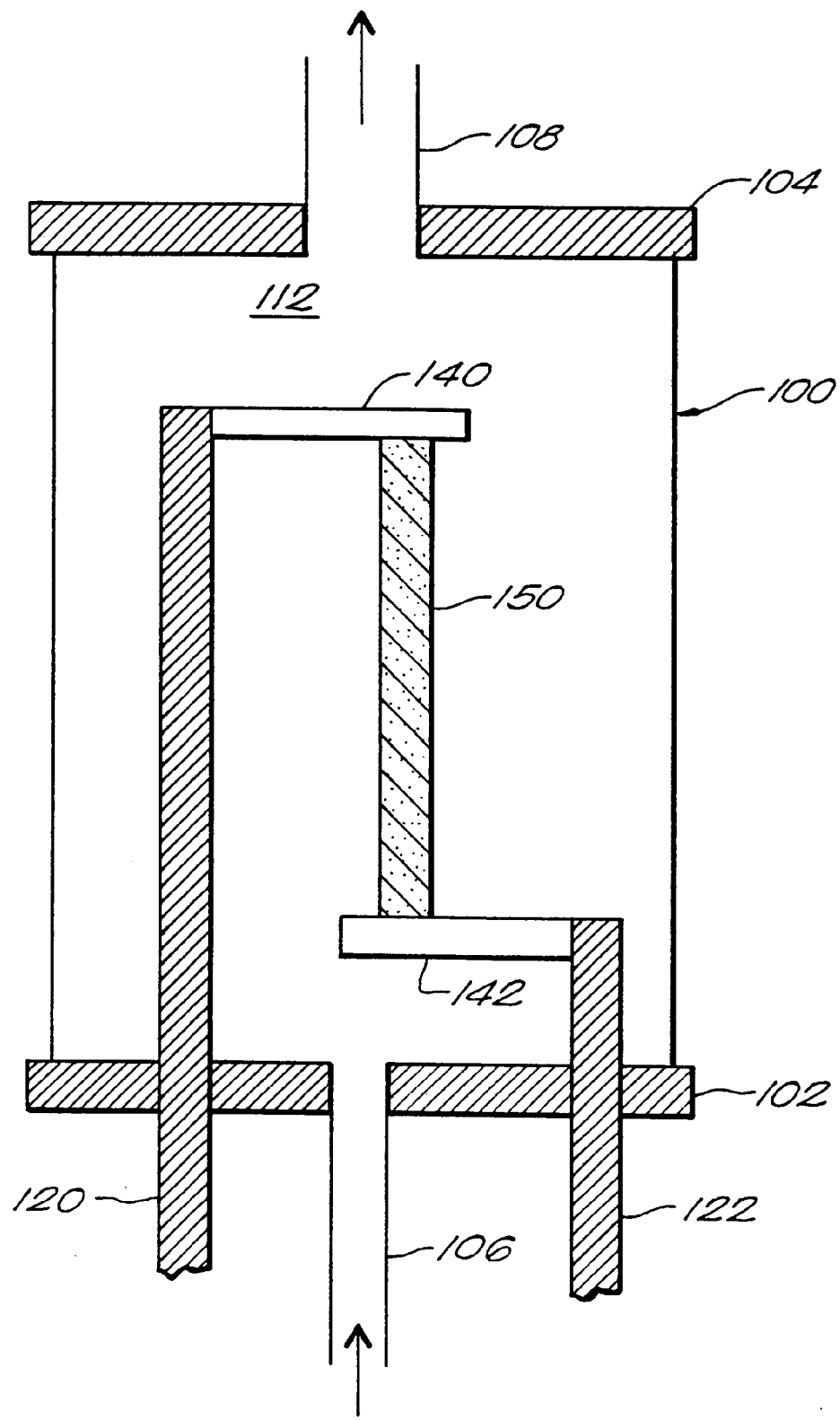
FIG. 2 is a schematic illustration of an apparatus suitable for carrying out the chemical vapor infiltration embodiment of this invention.

The surface-densified graphite coupons, prepared as described above, and an identical graphite coupon whose surface was not densified, were each placed into a 6" diameter by 24" long quartz tube filled with flanges at both ends, as illustrated in FIG. 2 and described hereinafter. One end of the reactor had pass-troughs for water cooled electrodes and a reactant gas inlet. The other end was fitted with an exhaust port. The electrodes were connected to a Hewlett-Packard™ regulated DC power supply. The coupons were clamped to the electrodes and a two-color optical pyrometer was aimed at the center of the coupon through the quartz tube.

After purging the reactor with nitrogen to remove air, the reactors were then purged with 5L/minute of hydrogen while heating the coupons to a temperature of 1300±10° C. When the coupon reached 1300° C., a flow of 3.4 L/minute of boron trichloride was added to the hydrogen flow into the reactor to vapor deposit boron on the surfaces of the graphite coupons. Boron deposit was then continued for about 30 minutes to form a boron coating having a thickness of about 125 microns.

The boron trichloride flow was then removed from the hydrogen flow into the reactor and the coupons were then slowly cooled over a period of 40 minutes by gradually reducing the current flow through the coupons.

After cooling, sections were cut from the center of each coupon and mounted and polished for metallographic examination. The result of the metallographic examinations were as follows:

a) untreated graphite, boron-coated coupon—good adhesion of the boron to the graphite was observed; however, multiple voids were noted in the boron coating near the boron-graphite interface;

b) boron-coating graphite coupon densified at 300 W/sq. in.—good adhesion of the boron to the graphite was observed; however, multiple voids were noted in the boron coating near the boron-graphite interface;

c) boron-coated graphite coupon densified at 350 W/sq. in.—good adhesion of the born to the graphite was observed with no voids visible in the boron coating; and d) boron-coated graphite coupon densified at 400W/ sq.in.—no voids were noted in the boron; however, separation was observed between the boron coating and the graphite.

Chemical Vapor Infiltration Embodiment

In another preferred embodiment of a method according to this invention, chemical vapor infiltration (CVI) is utilized instead of the previously-described rapid densification treatment to reduce the surface porosity of the substrate while preserving sufficient surface texture to insure good adherence of a subsequently applied boron coating. In this invention embodiment, pores in the substrate are at least partially filled by decomposing a gaseous hydrocarbon inside the pores by application of heat. Hydrocarbons useful for the CVI embodiment of this invention include methane, benzene, acetylene and others. Although CVI technology is generally known in the art, it has not previously been utilized for enhancing the surface characteristics of a substrate, such as graphite, prior to applying a boron coating.

It is well known that carbon can be deposited from methane or methane/argon mixtures at temperatures above about 1000° C. An apparatus suitable for carrying out the CVI embodiment of this invention is schematically illustrated in FIG. 2. FIG. 2 shows a reactor vessel 100, preferably a quartz tube, sealed at its two ends with flanges 102 and 104 respectively. Flange 102 includes a gas inlet 106 connected to metered sources of a suitable hydrocarbon such as methane, and an inert gas such as argon. Connections of gas inlet 106 to metered sources of other gases, such as nitrogen, hydrogen, and boron chloride, may also be provided so that the treatment step for the reduction of substrate porosity may be combined with the boron coating step in a two-step process carried out in a single apparatus. Flange 104 includes an exhaust or gas outlet 108. Thus, a gas or mixture of gases can be flowed into reactor 100 through inlet 106, through the interior 112 of reactor 100, and out through outlet 108.

Water-cooled electrode posts 120 and 122 pass through one of flanges 102 or 104 (shown as flange 102 in FIG. 2) and extend into the interior 112 of reactor 100. Inside reactor 100, posts 120 and 122 are connected respectively to clamp/ electrical contacts 140 and 142 which provide mechanical support for as well as electrical contact to the porous article 150 which is to be densified in accordance with the present invention.

The ends of electrode posts 120 and 122 external of reactor 100 provide connections to a supply of electrical power (not shown). In the invention embodiment shown in FIG. 2, chemical vapor infiltration is carried out on article 150 by applying electrical power to electrode posts 120 and 122 at an appropriate level to heat article 150 to the desired temperature for a sufficient period of time while flowing a suitable hydrocarbon gas through reactor 100 and past article 150. Upon completion of the densification step by means of chemical vapor infiltration, the supply of methane (or other hydrocarbon gas) or a hydrocarbon/inert gas mixture is stopped and the reactor 100 is swept with a cleansing gas such as nitrogen, or otherwise purged by means of a vacuum pump. When the reactor interior 112 has been adequately swept or purged, a flow of boron trichloride and hydrogen into reactor 100 can be started to deposit a high-quality boron coating on the prepared surface of article 150 by chemical vapor deposition. Alternatively, the hydrocarbon/inert gas flow may be purged by the boron trichloride/hydrogen gas flow itself. It will be apparent that different component elements inside and outside reactor 100 would be utilized where article 150 is heated by induction or radiant heating or by some other such heating means than the electrical resistance heating illustrated in FIG. 2.

Example 2 below utilized an apparatus substantially comparable to that illustrated in FIG. 2 for carrying out comparative tests to demonstrate the superiority of boron-coated graphite substrates when the substrates have been treated in accordance with the chemical vapor infiltration embodiment of this invention prior to being coated with boron.

It is clear that the objective of at least partially filling the surface porosity of a graphite or comparable substrate while preserving a satisfactory surface texture for adherence of a subsequently applied boron coating could be performed at numerous sets of conditions. At temperatures near 1000° C., the rate of carbon deposition is very slow and the times required for filling the substrate pores are too long to be of commercial value. The following illustrates experiments performed to find the gas compositions and temperatures which give the desired result in times comparable to the boron deposition time. These experiments define part of the upper limit boundary of acceptable deposition conditions. Exceeding the upper limit is judged by observing a shiny deposit, indicating a loss of surface texture, or by soot formation during the deposition process since either condition would produce an unacceptable surface for boron deposition.

It is also clear that the objective of the invention could be accomplished in other types of CVI apparatus. For example, commercial CVI processes for carbon are often performed in furnaces or "hot-wall reactors". In this case, the reactant gas is diluted with an inert gas and/or the chamber is operated at reduced pressure as additional means of controlling the deposition process. These parameters are adjusted depending on the size and geometry of the particular chamber; hence no general limits can be stated which both are applicable to all chambers and are optimized with respect to deposition time. Those skilled in the art will recognize that conditions for the achievement of the objective of the invention can be discovered through systematic experimentation in "hot-wall" CVI apparatus as well as in the resistive heating apparatus described in Example 2 below.

Example 2

A series of experiments were performed using graphite coupons heated by suitable means, such as electrical resistance heating, to achieve surface temperatures ranging from 1200° C. to 1300° C. In each experiment, coupons of DFP-2graphite identical to those used in the previous example were each placed into a 6" diameter by 24" long quartz tube as described in FIG. 2 with metered argon and methane supplies were connected to the reactant gas inlet port.

Coupons were clamped between the electrodes, and the reactor was purged with argon to eliminate air. Argon flow was 2.8 liters per minute. Methane flow was added at either 0.28 liters per minute (10:1 argon to methane ratio) or 0.55 liters per minute (5:1 argon to methane ratio). The coupon was brought to the desired deposition temperature, as indicated by the optical pyrometer, by the gradual increase of current from the power supply. The coupon was held at the nominal deposition temperature ±5° C. for a period of twenty minutes. At the end of this period, the power and methane flows were shut off and the samples allowed to cool under the argon flow. Coupons were removed and examined.

Temperatures above 1225° C. produced sooting and/or shiny deposits. Even at 1200° C., the argon/methane mixture at 5:1 ration produced a shiny deposit. The optimum conditions for this embodiment were found to be a deposition temperature of about 1210° C., an argon/methane ratio of about 10:1 and a deposition time of about 20 minutes.

It will be apparent to those skilled in the art that other changes and modifications may be made in the above-described apparatus and process without departing from the scope of the invention herein, and it is intended that all matter contained in the above description shall be interpreted in an illustrative and not a limiting sense.

Having described the invention, what I claim is:

1. A method for preparing a boron-coated surface on a porous substrate, said method comprising the steps of: (a) substantially surrounding a porous substrate with a first gas consisting essentially of a gaseous hydrocarbon; (b) while said substrate is surrounded by said first gas, heating the substrate to a temperature above the decomposition temperature of the hydrocarbon for a period sufficient to at least partially densify the surface of the substrate to reduce surface porosity, while maintaining adequate roughness in the surface of the substrate to promote mechanical locking with a subsequently applied elemental boron coating; and (c) coating the at least partially densified substrate surface with elemental boron.

2. A method according to claim 1 wherein said porous substrate is graphite.

3. A method according to claim 1 wherein said gaseous hydrocarbon is selected from the group consisting of methane, benzene, acetylene and mixtures thereof.

4. A method according to claim 1 wherein said first gas further includes an inert gas.

5. A method according to claim 4 wherein said inert gas is argon.

6. A method according to claim 1 wherein said substrate is electrically conductive.

7. A method according to claim 6 wherein said substrate is heated by electrical resistance heating.

8. A method according to claim 6 wherein said substrate is heated by induction heating.

9. A method according to claim 1 wherein said substrate is heated by radiant heating.

10. A method according to claim 1 wherein said porous substrate is supported inside a chamber and, during steps (a) and (b), said first gas is flowed continuously into said chamber, into contact with the surface of said substrate, and out of said chamber.

11. A method according to claim 10 further comprising the step of purging said chamber with a cleansing gas after the densification step is completed.

12. A method according to claim 10 further comprising the steps of flowing a cleansing gas through said chamber after the completion of step (b) to substantially remove all of the first gas, and thereafter flowing a second gas consisting essentially of boron trichloride and hydrogen into said chamber and into contact with the densified surface of the substrate so as to deposit said elemental boron coating on said densified surface of the substrate.

13. The method according to claim 12 wherein the cleansing gas comprises the second gas.

14. The method according to claim 10 further comprising the steps of purging the first gas from said chamber by means of a vacuum pump, and thereafter flowing a second gas into said chamber and into contact with the densified surface of the substrate so as to deposit said elemental boron coating on said densified surface of the substrate.

15. A method according to claim 1 further comprising the preliminary steps of carrying out step (b) over a range of substrate heating levels utilizing multiple substrates to determine an optimum substrate heating level for achieving optimized substrate surface properties as determined by minimization of surface voids consistent with satisfactory adhesion of the elemental boron coating in step (c).

* * * * *